United States Patent [19]

Kariya

[11] Patent Number: 4,667,110

[45] Date of Patent: May 19, 1987

[54] APPARATUS FOR HOLDING AN OBJECT BY USE OF ELECTROSTATIC ATTRACTING FORCE

[75] Inventor: Takao Kariya, Akikawa, Japan

[73] Assignee: Canon Kabushiki Kaisha, Tokyo, Japan

[21] Appl. No.: 830,746

[22] Filed: Feb. 19, 1986

[30] Foreign Application Priority Data

Feb. 21, 1985 [JP] Japan .................................. 60-033497

[51] Int. Cl.[4] ...................... H01J 37/20; H02N 13/00
[52] U.S. Cl. ............................... 250/492.2; 250/440.1; 250/442.1; 361/234
[58] Field of Search ............... 250/440.1, 442.1, 492.2; 361/234; 269/903; 310/309, 310; 192/21.5; 188/158

[56] References Cited

U.S. PATENT DOCUMENTS 3,993,509 11/1976 McGinty ..................... 250/492.21
4,163,168 7/1979 Ishikawa et al. ................. 250/442.1
4,412,133 10/1983 Eckes et al. ..................... 250/492.2

Primary Examiner—Bruce C. Anderson
Assistant Examiner—Jack I. Berman
Attorney, Agent, or Firm—Fitzpatrick, Cella, Harper & Scinto

[57] ABSTRACT

An apparatus for releasably holding an object on an electrically insulative member by use of an electrostatic attracting force which is produced by dielectrically polarizing the insulative member, wherein the apparatus includes a photoconductive layer having photoconductivity and is provided on at least one of a surface of the insulative member facing the object and a reverse surface of the insulative member, and a light source for producing a light beam to irradiate the photoconductive layer with the light beam, thereby to decrease the attracting force to be applied to the object.

11 Claims, 5 Drawing Figures

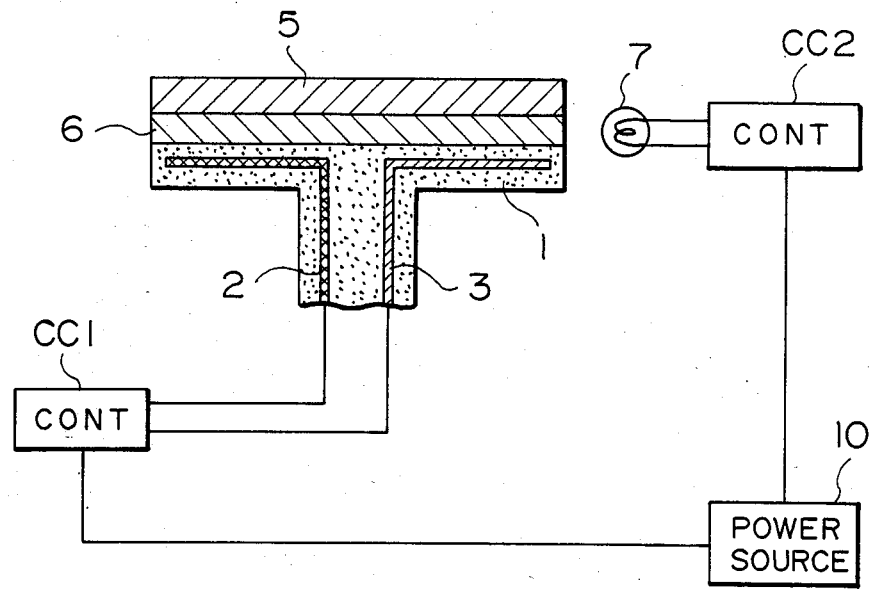
F I G. 1
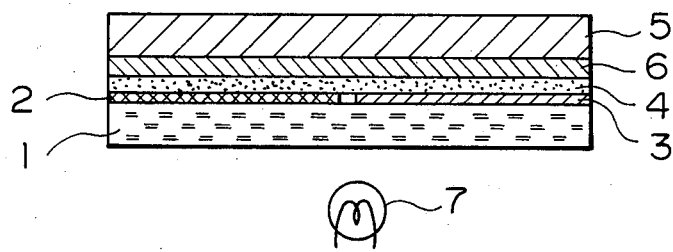
F I G. 2

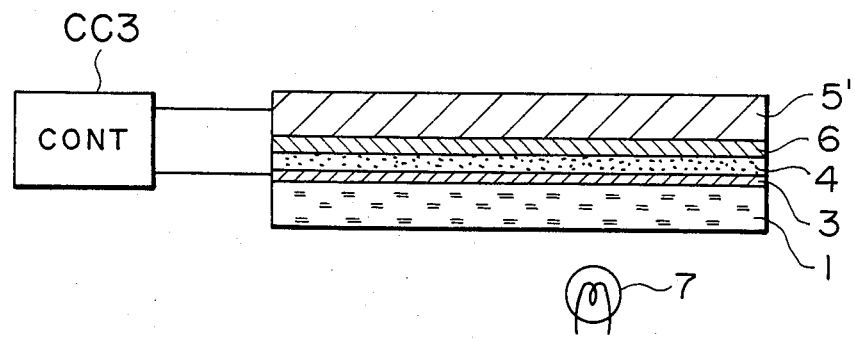
F I G. 3
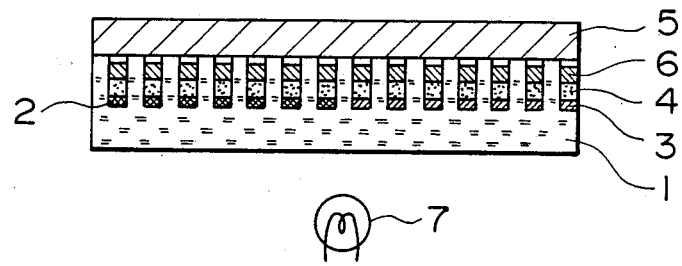
F I G. 4
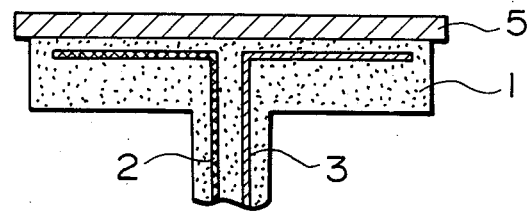
F I G. 5

4,667,110

APPARATUS FOR HOLDING AN OBJECT BY USE OF ELECTROSTATIC ATTRACTING FORCE

FIELD OF THE INVENTION AND RELATED ART

This invention relates to an apparatus for holding an object and, more particularly, to an apparatus for holding an object by use of an electrostatic attracting force.

A typical example of such holding apparatus is shown in FIG. 5. This apparatus is usable in semiconductor device manufacturing apparatuses such as an alignment and exposure apparatus, an etching apparatus, etc., using X-rays, an electron beam, an ion beam or the like, for releasably holding an object such as a mask or reticle, a semiconductor wafer or any other component of the machine. As shown in FIG. 5, the apparatus includes a base member 1 for releasably holding, by an electrostatic attracting force, an object 5 such as a sample or workpiece made of an electrically conductive or semiconductive material. The base member 1 is made of an electrically insulative material such as an organic material or a ceramic material. The apparatus further includes a pair of electrodes 2 and 3 embedded in the base member 1.

When, in operation, an electric voltage is applied across the electrodes 2 and 3, an electric field is produced in the insulative base member 1, the electric field at least partially extending into the workpiece 5. This causes dielectric polarization in the insulative base member 1, whereby an electrostatic attracting force is produced between the workpiece 5 and the electrodes 2 and 3. Thus, the workpiece 5 is electrostatically attracted to the base member 1.

In the apparatus of FIG. 5, however, if the supply of electric voltage to between the electrodes 2 and 3 is intercepted, the workpiece 5 remains attracted to the base member 1 for a certain period of time after the interception of the supply of electric voltage. This is because, even if the supply of electric voltage to between the electrodes 2 and 3 is intercepted, the portion of the insulative base member 1 located between the workpiece 5 and the electrodes 2 and 3 still remains dielectrically polarized, for a certain period of time. So, the electrostatic attracting force still acts on the workpiece 5 to continue holding the same. This presents quick release of the workpiece.

Further, in the holding apparatus described above, when no workpiece is held on the insulative base member 1 so that the surface of the base member 1 is exposed to ambient air, electrostatic charges on the surface of the base member 1 are deleteriously generated due to any flow of air or the like. So, dust or foreign particles easily adhere to the surface of the base member 1. This is very disadvantageous.

SUMMARY OF THE INVENTION

It is accordingly a primary object of the present invention to provide an apparatus for releasably holding an object by use of an electrostatic attracting force, in which apparatus the attraction of the object and, more particularly, the release of the held object can be made very quickly.

It is another object of the present invention to provide an apparatus for releasably holding an object by use of an electrostatic attracting force, which apparatus is free from disadvantageous adhesion of dust or foreign particles onto a supporting surface of the apparatus due to electrostatic charges produced on the supporting surface or electric charges having been produced to attract the object and remaining thereon after the object is released.

Briefly, according to one aspect of the present invention, there is provided an apparatus for releasably holding an object on an electrically insulative member by use of an electrostatic attracting force which is produced by electrically polarizing the insulative member, wherein the apparatus includes a photoconductive layer having photoconductivity and provided on at least one of a surface of the insulative member facing the object and a reverse surface of the insulative member, and a light source for producing a light beam to irradiate the photoconductive layer with the light beam, thereby to decrease the attracting force to be applied to the object.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 1 is a schematic and diagrammatic view showing a major portion of an electrostatically holding apparatus according to one embodiment of the present invention.

FIG. 2 is a sectional view schematically showing a major portion of an electrostatically holding apparatus according to another embodiment of the present invention.

FIG. 3 is a schematic and diagrammatic view showing a major portion of an electrostatically holding apparatus according to a further embodiment of the present invention.

FIG. 4 is a sectional view schematically showing a major portion of an electrostatically holding apparatus according to a still further embodiment of the prescent invention.

FIG. 5 is a sectional view schematically showing a major portion of an electrostatically holding apparatus of known type.

DESCRIPTION OF THE PREFERRED EMBODIMENTS

Referring first to FIG. 1, there is shown a major portion of an electrostatically holding apparatus according to one embodiment of the present invention.

In FIG. 1, the apparatus includes a base member 1 which is T-shaped in vertical section, as shown in FIG. 1. The base member 1 is made of an electrically insulative material such as an organic material or a ceramic material. A pair of electrodes 2 and 3 are embedded in the base member 1. These electrodes 2 and 3 are electrically connected to a common control circuit CC1 which is provided to control the supply of an electric voltage from an electric power source 10 to the electrodes 2 and 3, thereby to control energization of the electrodes 2 and 3. Denoted in FIG. 1 by numeral 5 is an object such as a sample or workpiece, which is made of an electrically conductive or semiconductive material in this embodiment.

The apparatus further includes a photoconductive film or layer 6 formed on the surface of the insulative base member 1 facing the workpiece 5. The layer 6 is made of such material that exhibits electric conductivity in response to irradiation with light. As such a material for the photoconductive layer 6, it is possible to use an organic, photoconductive and lighttransmissible material such as, for example, poly-N-vinylcarbazole; bromide poly-N-vinylcarbazole; chlorinated poly-N-vinylcarbazole; polyvinyl anthracene; polyvinyl acenaphthene; 2,5-diphenyl oxazole; 2,5-bis(P-aminophenol)-1,3,4-oxythiazole; 2,5-bis(P-aminophenol)-1,3,4-triazole; etc. Alternatively, a photoconductive and inorganic material such as silicon; titanium oxide; zinc oxide; cadmium sulfide; selenium; etc. may be used. It is a further alternative to use a composite of appropriate ones of these materials or a layered structure comprising layers of appropriate ones of these materials.

As for such photoconductive materials described above, a variety of materials having different spectral sensitivity characteristics are known. Also, the spectral sensitivity can be adjusted by adding any suitable pigment to the material.

The thickness of the photoconductive layer 6 is preferably 1–100 microns.

The word "light" used in this specification means any radiation energy such as infrared rays, visible rays, ultraviolet rays, deep UV rays, etc., which are effective to decrease the electric resistance of the photoconductive material.

In FIG. 1, the electrostatically holding apparatus further includes an illumination device 7 which is provided to illuminate the photoconductive layer 6. The illumination device 7 comprises, for example, an incandescent lamp, a fluorescent lamp, a Hg lamp, a laser oscillation type illumination device, or the like. The illumination device 7 (hereinafter simply "lamp") is disposed at the side of the photoconductive layer 6 so as to irradiate the same in a direction (horizontal as viewed in FIG. 1) which is perpendicular to the direction of attraction of the workpiece 5 (which is vertical in FIG. 1), as will be described later. An optical fiber or other optical means such as mirrors or lenses may be used to guide the light to the photoconductive layer 6. The lamp 7 is electrically connected to a control circuit CC2 which is, in turn, electrically connected to the power source 10. The control circuit CC2 is arranged to control supply of an electric voltage from the power source 10 to the lamp 7, thereby to control energization of the lamp 7.

In operation, the workpiece 5 having electric conductivity is placed on the photoconductive layer 6, and the electric voltage from the power source 10 is applied by way of the control circuit CC1 to the electrodes 2 and 3, with the power supply to the lamp 7 being intercepted. In response to the application of the voltage to the electrodes 2 and 3, the insulative base member 1 and the photoconductive layer 6 are dielectrically polarized, so the workpiece 5 is held on the photoconductive layer 6 by the electrostatic attraction. When in such state a, the electric power of the power source 10 is supplied by way of the control circuit CC2 to the lamp 7 to energize the same, and the photoconductive layer 6 becomes electrically conductive. Since, at this time, the voltage is still being applied to between the electrodes 2 and 3, the insulative base member 1 is maintained in the polarized state. However, the photoconductive layer 6 is now electrically conductive, so that the photoconductive layer 6 functions as a shield against the electric lines of force produced by the dielectric polarization of the insulative base member 1. As a result, the electrostatic attracting force to be applied to the workpiece 5 is decreased or substantially prevented. Thus, it is now possible to easily release the workpiece 5 from the photoconductive layer 6. If, at this time, the lamp 7 is deenergized, the workpiece 5 can, of course, be attracted to and held on the photoconductive layer 6 again. It is a possible alternative that, when the lamp 7 is energized to illuminate the photoconductive layer 6, the power supply to the electrodes 2 and 3 is intercepted.

FIG. 2 shows an electrostatically holding apparatus according to another embodiment of the present invention. In this embodiment, the apparatus includes an electrically insulative base member 1 which is made of a material having good light-transmissibity. As such a material, an inorganic material such as, for example, glass, BN, $Si_3N_4$ or the like, or an organic material such an acrylic polycarbonate, polyimide or the like is usable. The apparatus also includes electrodes 2 and 3 formed on the base member 1. Each of the electrodes 2 and 3 is provided by an electrically conductive thin-film layer, composed of carbon, Ni, Ag, An or the like, to form a "half mirror". Additionally, in this embodiment, the apparatus is provided with an electrically insulative layer 4 which is formed on the thin-film electrodes 2 and 3. The insulative layer 4 is made of a material having good light-transmissibility. As such a material, an inorganic material such as BN, $Si_3N_4$ or the like is usable. Alternatively, polyimide, polystyrol or the like may be used. Formed on the insulative layer 4 is a photoconductive film or layer 6 which corresponds to the photoconductive layer 6 in the FIG. 1 embodiment.

In this embodiment, an illumination device 7 for irradiating the photoconductive layer 6 to decrease or shield the attracting force to be applied to the workpiece 5 is disposed at the back of the insulative base member 1, so the photoconductive film 6 is irradiated with light in a direction (upward in FIG. 2) opposing to the direction of attraction of the workpiece 5 (downward in FIG. 2). The attracting/releasing operation of the apparatus of the present embodiment is essentially the same as that of the FIG. 1 embodiment. Therefore, description thereof will be omitted here only for the sake of preventing redundancy.

A further embodiment of the present invention will now be described, taken in conjunction with FIG. 3. The FIG. 3 embodiment is a modification of the FIG. 2 embodiment. The FIG. 3 embodiment is particularly suitable for use in a device for producing resistance to movement of a movable member such as an X-Y table in a semiconductor device manufacturing apparatus or any other movable component of a machine. In FIG. 3, the movable member is denoted by numeral 5' and the apparatus is arranged so that an electric voltage is applied between the movable member 5' and an electrode 3, by way of a power-supply controlling circuit CC3. When the electric voltage from an unshown power source is supplied by way of the control circuit CC3 to between the movable member 5' and the electrode 3, an electrostatic attracting force is produced and, as a result of which, the movable member 5' is attracted downwardly as viewed in FIG. 3. This downwardly attracting force provides resistance to the movement of the movable member 5' and, therefore, provides a braking force or clamping force relative to the movable member 5'. The manner of decreasing or preventing the attracting force to be applied to the movable member 5' by the irradiation of the photoconductive layer 6 by means of the light source 7 is essentially the same as that of the FIG. 2 embodiment.

FIG. 4 shows an electrostatically holding apparatus according to yet another embodiment of the present invention. In this embodiment, portions of the insulative base member 1 extend upwardly through and beyond the electrodes 2 and 3, the insulative layer 4 and the photoconductive layer 6, so that the photoconductive layer 6 is prevented from being brought into contact with the lower surface of the workpiece 5. This arrangement effectively avoids deleterious abrasion of the photoconductive layer 6, thereby extending the service life thereof. Therefore, the height of the apparatus with respect to holding the workpiece can be accurately and stably maintained constant. It will be seen from FIG. 4 that each of the insulative layer 4 and the photoconductive film 6 is divided into plural and discrete segments to produce a specific pattern. For such a pattern, any pattern can be used if the protrudent portions of the insulative base member 1 provide substantially flat or even support relative to the workpice 5. For example, a stripe pattern or a grid-like pattern, providing pin-chuck support, may be used.

In accordance with the present invention, as has hitherto been described, a photoconductive film is formed on an attracting surface of a base member, and the attracting force to be applied to the workpiece is decreased or prevented by irradiating the photoconductive film with light, thereby rendering the whole or a part of the attracting surface electrically conductive. Thus, release of the workpiece can occur independently of the charging of the insulative base member. As a result, the workpiece can be released promptly and, therefore, high-speed responsiveness of the apparatus with respect to holding/releasing the workpiece is assured. Further, the electric charges on the attracting surface can be removed substantially fully. Accordingly, undesirable adhesion of dust or foreign particles onto the attracting surface due to any residual electrostatic charges can be prevented. The capability of quick removal of electric charges on the attracting surface is advantageous also for the following reason: That is, when, in conventional electrostatic holding apparatus, an attempt is made to remove any foreign particles adhering to the attracting surface, as by means of a high-speed gas flow, a mechanical wiper or a brush, electrostatic charges are caused thereby which disadvantageously increases the strength of adhesion of the foreign particles onto the attracting surface. Such problem can be fully solved by the present invention. Namely, according to the present invention, substantially no electrostatic charge remains on the attracting surface, so any foreign particles on the attracting surface can be removed very easily.

While the invention has been described with reference to the structures disclosed herein, it is not confined to the details set forth and this application is intended to cover such modifications or changes as many come within the scope of the following claims.

What is claimed is:

1. In an apparatus for releasably holding an object on an electrically insulative member by use of an electrostatic attracting force wherein the electrostatic attracting force is produced by polarizing the insulative member, the improvement comprising:
   a photoconductive layer having photoconductivity and provided on at least one of a surface of the insulative member facing the object and a reverse surface of the insulative member; and
   a light source for producing a light beam to irradiate said photoconductive layer with the light beam;
   whereby the electrostatic attracting force to be applied to the object is decreased in response to the irradiation of the photoconductive layer with the light beam.

2. An apparatus according to claim 1, wherein the apparatus is adapted to hold an object is composed of an electrically conductive or semiconductive material.

3. An apparatus according to claim 1, wherein said photoconductive layer is irradiated with the light from said light source, in a direction opposite to the direction of attraction of the object to the insulative member.

4. An apparatus according to claim 1, wherein said photoconductive layer is irradiated with the light from said light source, in a direction perpendicular to the direction of attraction of the object to the insulative member.

5. An apparatus according to claim 1, wherein the electrically insulative member is composed of a light-transmissible material.

6. An apparatus according to claim 1, further comprising an electrode operative to electrically polarize the insulative member, wherein said electrode is composed of a light-transmissible material.

7. An apparatus according to claim 1, wherein said photoconductive film is embedded in the electrically insulative member.

8. A method of releasably holding an object by use of an electrostatic attracting force, said method comprising:
   producing the electrostatic attracting force to attract and hold the object on a base member having a photoconductive film formed on its surface facing the object; and
   irradiating the photoconductive film with light to decrease the electrostatic attracting force to be applied to the object, such that easy separation of the object from the base member results.

9. A method according to claim 8, wherein the electrostatic attracting force is continuously produced during irradiation of the photoconductive film with light.

10. A method according to claim 8, further comprising stopping the irradiation of the photoconductive film with the light so as to hold again the object onto the base member by the electrostatic attracting force.

11. An apparatus for applying a resistance to movement of a movable member, said apparatus comprising:
   an electrically insulative member;
   means for polarizing said insulative member to produce an electrostatic attracting force to be applied to the movable member, said electrostatic attracting force providing the resistance to the movement of the movable member;
   a photoconductive layer having photoconductivity and provided on at least one of a surface of said insulative member facing the object and a reverse surface of said insulative member; and
   a light source for producing a light beam to irradiate said photoconductive film with the light beam;
   whereby the electrostatic attracting force to be applied to the object is decreased in response to the irradiation of said photocoductive layer with the light beam and whereby the resistance to the movement of the movable member is substantially removed.

* * * * *

UNITED STATES PATENT AND TRADEMARK OFFICE
CERTIFICATE OF CORRECTION

PATENT NO. : 4,667,110
DATED : May 19, 1987
INVENTOR(S) : TAKAO KARIYA

It is certified that error appears in the above-identified patent and that said Letters Patent is hereby corrected as shown below:

COLUMN 1

Line 46, "presents" should read --prevents--.

COLUMN 6

Line 8,   "is adapted" should read --adapted--.
    Line 27, "film" should read --layer--.
    Line 32, "the" should read --an--.
    Line 45, "hold again" should read --again hold--.

Signed and Sealed this

Fifteenth Day of September, 1987

*Attest:*

DONALD J. QUIGG

*Attesting Officer*     *Commissioner of Patents and Trademarks*